United States Patent [19]

Maurer et al.

[11] Patent Number: 4,636,729
[45] Date of Patent: Jan. 13, 1987

[54] GRADIENT COIL SYSTEM FOR A NUCLEAR SPIN TOMOGRAPHY INSTALLATION

[75] Inventors: Arnolf Maurer, Bubenreuth; Horst Siebold, Erlangen, both of Fed. Rep. of Germany

[73] Assignee: Siemens Aktiengesellschaft, Munich, Fed. Rep. of Germany

[21] Appl. No.: 696,104

[22] Filed: Jan. 29, 1985

[30] Foreign Application Priority Data

Feb. 20, 1984 [DE] Fed. Rep. of Germany ....... 3406052

[51] Int. Cl.[4] ............................................. G01R 33/20
[52] U.S. Cl. ..................................... 324/318; 335/299
[58] Field of Search ............... 324/318, 319, 320, 322, 324/307, 309; 335/299, 300; 336/100, 199, 208, 225, 65

[56] References Cited

U.S. PATENT DOCUMENTS

| | | | |
|---|---|---|---|
| 4,362,993 | 12/1982 | Young et al. | 324/309 |
| 4,438,400 | 3/1984 | Patt | 324/312 |
| 4,456,881 | 6/1984 | Compton | 324/319 |
| 4,517,516 | 5/1985 | Hill et al. | 324/318 |
| 4,527,124 | 7/1985 | van Uijen | 324/309 |
| 4,560,933 | 12/1985 | Forster et al. | 324/319 |

FOREIGN PATENT DOCUMENTS 0105565 4/1984 European Pat. Off. ............ 324/307

Primary Examiner—Stephen A. Kreitman
Assistant Examiner—Scott M. Oldham
Attorney, Agent, or Firm—Kenyon & Kenyon

[57] ABSTRACT

The gradient coil system for a nuclear spin tomography installation encloses a hollow cylindrical support body, the cylinder axis of which extends in the z direction of an orthogonal x-y-z coordinate system with the coordinate origin in the imaging center, in which direction also the magnetic field $B_z$ of a base generating a field gradient $G_z$, at field magnet is oriented. The gradient coil system contains for least two ring-shaped individual coils which are arranged symmetrically to the x-y plane extending through the imaging center, and furthermore, pairs of saddle-shaped individual coils arranged symmetrically to this plane, for generating field gradients $G_x$ and $G_y$. In this gradient coil system, the sound level caused in the hollow cylindrical support body is reduced by rigidly connecting the prefabricated $G_x$ and $G_y$ gradient coils which lie on one side relative to the x-y symmetry plane to each other to form self-supporting partial baskets and by means of several non-magnetic carrier elements extending in the z direction forming a common self-supporting coil basket from these partial baskets to which the prefabricated $G_z$ gradient coils are fastened; and attaching this coil basket to the carrier body via insulating elastic support elements.

20 Claims, 7 Drawing Figures

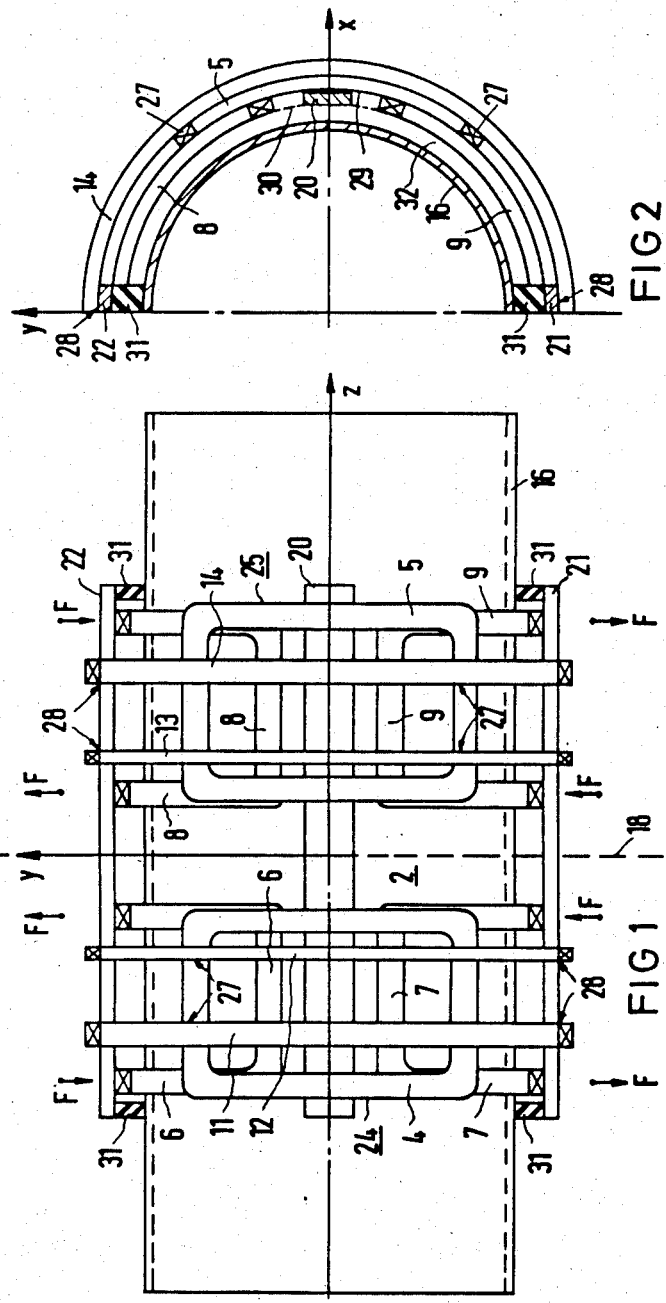

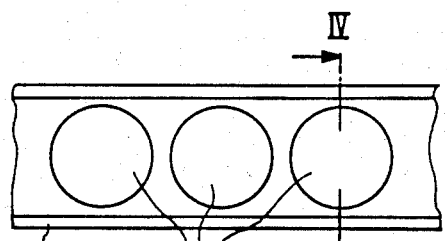
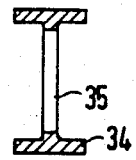
FIG 3     FIG 4
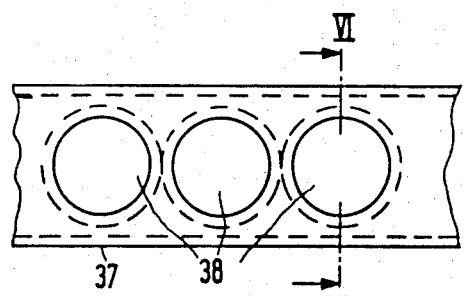
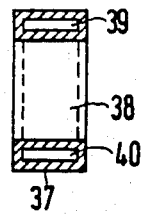
FIG 5     FIG 6
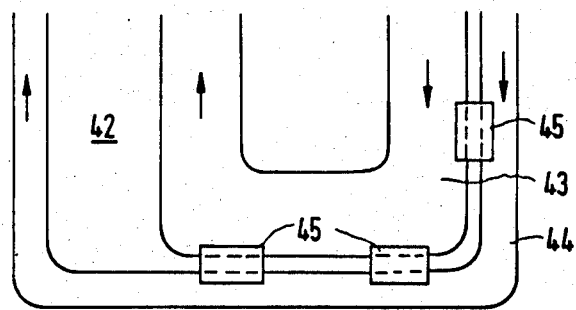
FIG 7

GRADIENT COIL SYSTEM FOR A NUCLEAR SPIN TOMOGRAPHY INSTALLATION

BACKGROUND OF THE INVENTION

This invention relates to nuclear spin tomography or nuclear resonance tomography, in general and more particularly, to a gradient coil system for use in a nuclear spin tomography installation.

A gradient coil system for a nuclear spin tomography installation which surrounds a hollow cylindrical support body, the cylindrical axis of which extends in the z direction of an orthogonal x-y-z coordinate system with the coordinate origin in the center of an imaging region, in which direction the magnetic field $B_z$ of a base field magnet comprising several field coils is also oriented, which gradient coil system contains, for generating a largerly constant field gradient $G_z = \partial B_z / \partial z$, at least two annular individual coils which are at least approximately symmetrical to the x-y plane extending through the center of the imaging range, and further, at least one set of pairs of saddle-shaped individual coils which are arranged at least approximately symmetrically with respect to this symmetry plane, for each of the x and y axes, and which are provided for generating field gradients $G_x = \partial B_z / \partial x$, in the x direction largely constant in the imaging range or corresponding field gradients $G_y = \partial B_z / \partial y$, in the y direction is described in the published European Patent Application EP No. 56 691 Al.

In the field of medical diagnostics, image producing methods have been developed, in which, through computer or measurement analysis of integral resonance signals of nuclei such as protons, an image similar to an X-ray tomogram can be constructed from the spatial spin density and/or relaxation time distribution of a body to be examined, especially a human body. The corresponding method is called nuclear spin tomography, nuclear magnetic resonance tomography, or also zeugmatography ("Nature", vol. 242, 1973, pages 190 and 191).

For nuclear spin tomography (nuclear magnetic resonance tomography) installations, a strong stationary base field, for instance, of the order $B_0 = 1.5$ T is desired, on the intensity of which the magnitude of the resonance signal depends and which must meet stringent requirements with respect to its homogeneity. Thus, a suitable base field magnet which generally consists of several coil sections must have a field deviation of less than 50 ppm in a spherical volume with a diameter of about 50 cm.

This magnetic base field will be assumed to be oriented, for instance, in the z direction of an orthogonal x-y-z coordinate system, where the z axis is the examination axis, along which the body to be examined is placed in the magnetic field. The coordinate origin is to be placed in the center of the imaging or examination area.

A high-frequency coil arrangement for the corresponding precession frequency of the nuclear spins to be considered in order to excite these spins and, optionally also receive the induction signals, must also be provided.

Finally, a system of gradient coils is required which operate set of supplemental fields $G_z = \partial B_z / \partial z$, $G_x = \partial B_z / \partial x$ and $G_y = \partial B_z / \partial y$. These supplemental fields are small as compared to the base field $B_z$ oriented in the z direction. The gradient fields, switched on in a predetermined order, permit a distinction as to the location, by the course of the precession frequency of the nuclei versus the location (see, for instance, "Journal of Magnetic Resonance", vol. 18, 1975, pages 69 to 83 or vol. 29, 1978, pages 355 to 373).

In general, the mentioned field gradients $G_x$, $G_y$ and $G_z$ can be generated by magnetic quadrupoles. In the case of installations for nuclear spin tomography, it is necessary to take into consideration that these coils must be arranged in the interior of the base field magnet, and sufficient space must remain empty for supporting the body to be examined.

The corresponding gradient coils of the nuclear spin tomography installation known from the cited European application are rigidly connected to a hollow cylindrical support body which can be inserted into the base field magnet; the support axis coincides here with the magnet axis and points in the z direction of an orthogonal x-y-z coordinate system. The z gradient $G_z$ is generated by two ring coils which are arranged symmetrically to an x-y plane which is oriented perpendicularly with respect to the cylinder axis and goes through the center of the imagining area. For generating the x gradient, $G_x$, two pairs of saddle-shaped coils are provided, the coils of each pair being put in place in a diametrical position on the outer shell of the hollow cylindrical support body. For the y gradient, $G_y$, a corresponding system of four saddle coils is provided which are arranged shifted on the support body by 90 degrees in the circumferential direction relative to the x gradient coils. The two pairs of individual coils of each set of coils are arranged symmetrically on both sides of the mentioned x-y plane. Besides a direct fastening of the individual gradient coils on the hollow cylindrical support body, a separate mounting tube can optionally also be used, on which the individual coils are placed. The mounting tube itself is then supported on the inner hollow cylindrical support body which is substantially longer.

The form, subdivision and arrangement of the individual $G_x$ and $G_y$ saddle coils and the $G_z$ ring coils are given. If they are operated in the strong base field, socalled Lorentz forces occur, which engage the coils as distributed loads. These Lorentz forces are variable due to typical switching sequences of the individual gradient fields in the coils, so that these coils, themselves, are excited to force vibrations. Through solid-borne and air-borne sound, the picked up energy is transferred from the coil system, and possibly, via the separate mounting tube to the hollow cylindrical support tube which acts somewhat as a loudspeaker diaphragm, and thereby fills the space containing the body to be examined with sound waves, the frequencies of which are mainly in the range between 200 Hz and 1000 Hz. Thus, it was possible, for instance, to measure, in the center of the useful volume, sound levels of up to 95 dB(A) which are insufferably high for a patient to be examined. For limiting the radiated power, the gradient coils can be operated with a smaller nominal current; this, however, leads to a corresponding reduction of the image quality of the nuclear spin tomography installation.

It is, thus, an object of the present invention to develop the gradient coil system mentioned at the outset in such a way that a reduction of the sound level caused by it in the hollow cylindrical support body is achieved without having to tolerate, therewith, a reduction of the image quality.

SUMMARY OF THE INVENTION

According to the present invention, this problem is solved by connecting the x and y gradient coils to each other to form a self-supporting partial gasket; using several support elements of non-magnetic insulating material extending in the z direction to form a self-supporting coil basket with the partial baskets formed on each side of the x-y symmetry plane; fastening the z gradient coils to the support elements; and attaching the coil basket to the hollow cylindrical support body with insulating elastic support elements.

According to the present invention, a separate mounting tube for the gradient coils and also direct placement of these coils on the tubular support body is dispensed with entirely. Instead, a connection as stiff as possible of all saddle coils of the x and y gradient system to form a self-supporting coil basket is provided. The ring coils of the z gradient system are used for additional stiffening. The entire coil basket is designed so that internal torques which attack the individual coils due to the alternating forces during the switching sequences of x and y gradients at the individual coils are compensated, at least largely, at any time. The advantages connected with this embodiment of the gradient coil system are seen particularly in the fact that the coil basket can then be mounted via relatively elastic support elements to the hollow cylindrical support body and thereby, the transmission of the vibrations of the coil basket to the support body can be attenuated correspondingly. The sound power radiated to the imaging region is, therefore, reduced accordingly.

BRIEF DESCRIPTION OF THE DRAWINGS

FIG. 1 is a top view of a gradient coil system according to the present invention illustrated schematically.

FIG. 2 is a partial cross section through the coil system of FIG. 1.

FIG. 3 is an elevation view of a support element.

FIG. 4 is a cross section through the support element of FIG. 3.

FIG. 5 is an elevation view of another support element.

FIG. 6 is a cross section through FIG. 5.

FIG. 7 is a schematic plan view of an embodiment of individual saddle-shaped coils for this gradient coil system.

DETAILED DESCRIPTION

In the installation for nuclear spin tomography, for which the gradient coil system according to the present invention is to be provided, known magnet coil arrangements are taken as the starting point. A corresponding magnet coil arrangement is indicated, for instance, in the European application mentioned at the outset. This magnet coil arrangement has at least one field coil system which is arranged concentrically with respect to the z axis of an orthogonal x-y-z coordinate system, especially a superconducting field coil system for generating a homogeneous magnetic base field in the z direction. Gradient coils are, furthermore, provided for generating sufficiently constant magnetic field gradients in an imaging range, in the center of which the origin of the coordinate system is to be located. The arrangement of the magnet coils permits axial access to the homogeneous field region at its center, i.e., the body, particularly the human body to be examined, is placed into the magnetic field along the z axis. The nuclear spin is excited by means of a high frequency field, directed perpendicularly to the z axis, by coils which can also serve as receiving coils for receiving the nuclear spin resonance signals.

For such an installation for nuclear spin tomography, the gradient coil system according to the present invention can advantageously be provided. The arrangement of an individual coil of this system can be seen in detail in FIGS. 1 and 2, like parts in the Figures being provided with the same reference symbols. The coil system, by which gradient fields in the x, y and z direction, which are sufficiently linear in an imaging region are to be generated, is designed according to the present invention as a self-supporting hollow cylindrical coil basket which is generally designated 2 in the Figures. This coil basket 2 contains two pairs of two saddle-shaped individual coils as well as a set of, preferably, four ring-shaped individual coils (see DE-OS No. 31 33 933). According to the presentation of the Figures, only the saddle-shaped coils 4 to 9 and ring-shaped coils 11 to 14 can be seen, at least in part. These individual coils enclose a hollow cylindrical support body 16, the cylinder axis of which is to point in the z direction of an orthogonal x-y-z coordinate system. The z axis is at the same time the examination axis, along which the body to be examined can be placed into the examination or imaging region. In this region, a magnetic field $B_z$ of a base field magnet, not shown, is to be at least largely homogeneous and oriented in the z direction. The coordinate origin of the x-y-z coordinate system is placed in the center of this imaging region.

The saddle-shaped individual coils 6 and 7, and 8 and 9, each form a pair of coils which serves, for instance, for generating the $G_y$ gradient field, while then the coils 4 and 5 each represent the one half of a pair of coils for generating the $G_x$ gradient field. The two $G_x$ coil pairs as well as the corresponding $G_y$ coil pairs are arranged symmetrically with respect to the x-y plane extending through the center of the imaging region. This symmetry plane is indicated by a dashed line 18. Similarly, the ring-shaped individual $G_z$ coils 11 and 12 are also symmetrical to the coils 13 and 14 with respect to this plane 18.

The eight individual saddle-shaped coils as well as the, for instance, four ring-shaped coils of the gradient coil system according to the present invention, together, form with several support elements, preferably with four support elements extending in the z direction, the intrinsically stiff, self-supporting coil basket 2. From FIG. 1, only six of the eight saddle-shaped coil windings 4 to 8, the four ring-shaped individual coils 11 to 14 as well as only three support elements 20 to 22 of the four assumed support elements can be seen. The coil basket 2 is designed as follows: On each side relative to the x-y symmetry plane 18, four saddle coils and two ring coils each form a tubular basket section, i.e., sections 24 and 25, respectively. Accordingly, the basket section 24 is associated with the individual coils 4, 6, 7, 11 and 12 visible in FIG. 1, and the basket section 25 is associated with the corresponding individual coils 5, 8, 9, 13 and 14, respectively. In each basket section, two saddle coils of each of the x and y gradient coil system are diametrically opposite each other. The individual preformed saddle coils are advantageously, at least largely, of the same design and can overlap especially at their longitudinal edges. Thus, according to the embodiment shown, for instance, the overlap zone can occupy an angle of about 37 degrees. If high dimensional accuracy is required, the four saddle coils of a basket section can be cemented to form a structure as rigid as possible. With a varying gap caused by manufacturing tolerances between the coils arranged on top of each other, casting over with a viscous plastic material, for instance, a synthetic resin is available. For stiffening the basket section further, the respective ring coils 11, 12, 13 and 14, respectively, are rigidly connected at the crossings 27 to the saddle coils enclosed by them, for instance, by clamping or cementing.

The two basket sections 24 and 25 of the coil system according to the present invention are rigidly connected to each other by means of the support elements 20 to 22 to form the entire coil basket 2. To this end, two support elements 20 extend over the four x gradient coils 4 and 5 and the two further longitudinal support elements 21 and 22 over the four y gradient coils 6 to 9. The support elements may have, for instance, rectangular cross section. In particular, however, a double T-shaped cross section may also be provided, where then, slots are provided in the support elements in the region of the crossings, corresponding to the respective gradient coils, into which slots the coils are fitted. As can be seen particularly from the partial end face view of FIG. 2, the support elements 21 and 22 connecting the individual coils 8 and 9 to the individual coils 6 and 7 together with the individual coils 4 and 5 are arranged on the outside of a cylindrical surface 29. This outer cylinder surface encloses the individual coils 6 to 9 which, in turn, are arranged on a concentric cylinder surface 30. On this inner cylinder surface 30 the support elements 20 which connect the individual coils 4 and 5 are also located. In this manner it can be achieved that no additional radial space for the support elements becomes necessary, in spite of different radial positions of the x and y radial coils. The ring coils 11 to 14 of the z gradient system can then be rigidly connected at all crossings 27 to the radially outer disposed individual coils 4 and 5, and at the crossings 28, to the outer support elements 21 and 22, mechanically or by cementing. If still greater stiffness of the overall basket 2 is to be achieved, the ring coils 11 to 14 can additionally be connected to the support elements 20, suitably shaped intermediate pieces to fill out the radial spacing between the coils and the elements in the respective crossing regions, and then cementing these parts to each other, forming a rigid connection.

The support elements 20 to 22 extending in the z direction are advantageously connected in the center of the arc parts extending in the circumferential direction of the saddle-shaped coils to the latter, since the centers of gravity of the Lorentz forces of the individual coils are located there. This means that only forces, but no torques, are coupled into the support elements. In FIG. 1, the forces F which are active in the operation of the y gradient coil system are indicated by lines with arrows. F is here the Lorentz force vectorially integrated over the arc section of the respective saddle coil. Optionally, also a larger number of support elements and accordingly, an arrangement of these elements deviating from the illustrated embodiment can be provided. Suitable as materials for the support elements are insulating non-magnetic materials which ensure sufficient stiffness of the coil basket 2. Particularly, well-suited is laminated wood or fiberglass-reinforced plastics which have a low specific gravity. Because of the larger damping due to internal friction, a fiberglass-reinforced plastic material is especially advantageous.

The coils basket 2 is supported via special insulating and relatively elastic support elements 31, such as molded rubber parts which are attached in several predetermined axial positions between the support elements 20 and 22 and the hollow cylindrical support body 16. The axial positions of these support elements 31 are fixed so that they come to lie, for the coil basket 2 and the support body 16, in zones which are free of vibrations as far as possible.

Since, in the embodiments of the gradient coil system in the form of a coil basket 2 according to the present invention, a separate rigid mounting tube for the coils is eliminated, there remains, in general, an empty gap 32 with a radial dimension of several centimeters between the coil basket and the hollow cylindrical support body 16 supporting it. In this gap parts that absorb air-borne sound, such as mats of porous material, for instance, of fibers or open cell foam can advantageously be supported.

The sound power radiated by the vibrating parts of the coil basket 2 perpendicular to their surfaces can be reduced further if relatively large areas are resolved into several small sub-surfaces. Several measures of this type can be seen in FIGS. 3 to 7. Thus, specially designed support elements extending in the z direction can be used, for instance, according to FIGS. 3 to 6. Thus, the support element 34 which is shown in FIGS. 3 and 4 in a top view and cross section, respectively, which may consist, in particular, of a fiberglass-reinforced plastic, is provided with circular recesses 35 which are arranged one behind the other in the z direction with spacing. The support element 34 itself has the shape of a double-T.

In FIGS. 5 and 6 a further example for a corresponding support element 37 in views corresponding to FIGS. 3 and 4 can be seen. However, in contrast to the support element 34, according to FIGS. 3 and 4, this support element, likewise provided with circular recesses 38, has a rectangular cross section. In the border regions associated with the small sides of the support element, a narrow hollow space 39 or 40 can be formed which extends in the z direction.

A resolution of the vibrating areas into smaller sub-areas may also be provided for the saddle coils. A corresponding example can be seen from the partial top view of FIG. 7. Accordingly, at least some of the saddle coils 42 of the gradient coil system according to the present invention can be separated into partial saddles 43 and 44 (see, for instance, DE-OS No. 31 33 873). These partial saddles 43 and 44 are kept spaced by special elastic shaped parts 45, for instance, of rubber.

What is claimed is:

1. In a gradient coil system for a nuclear spin tomagraphy installation which encloses a hollow cylindrical support body, the cylinder axis of which extends in the z direction of an orthogonal x-y-z coordinate system with the origin of the coordinates in the center of an imaging region, in which direction the magnetic field $B_z$ of a base field magnet comprising several field coils is also oriented, which gradient coil system contains, for generating a z field gradient which is largely constant in the imaging region at least two ring-shaped $G_z$ individual coils arranged at least approximately symmetrically to the x-y plane extending through the center of the imaging region, and further contains at least one set each of pairs of saddle-shaped $G_x$ and $G_y$ individual coils which are arranged at least approximately symmetrically with respect to said x-y plane and which are provided for generating x and y field gradients which are largely constant in the imaging region, the improvement comprising:

(a) the prefabricated saddle-shaped $G_x$ and $G_y$ gradient coils on each side of the x-y plane being rigidly connected to each other to form a self-supporting partial basket;

(b) several longitudinal support elements of non-magnetic insulating material extending in the z direction to which the prefabricated ring-shaped $G_z$ gradient coils are fastened and to which the partial baskets which are formed on both sides of the x-y symmetry plane are fastened to form a common self-supporting coil basket; and (c) insulating elastic support elements attaching the coil basket to the hollow cylindrical support body.

2. A gradient coil system according to claim 1, wherein the saddle-shaped $G_x$ and $G_y$ gradient coils have a dimension in the circumferential direction such that they mutually overlap.

3. A gradient coil system according to claim 2, wherein said saddle-shaped gradient coils are arranged on different cylinder surfaces.

4. A gradient coil system according to claim 2, wherein said saddle-shaped gradient coils are fastened together in their mutual overlap zones.

5. A gradient coil system according to claim 4, wherein said longitudinal support elements are each fastened to the arc sections of the saddle-shaped gradient coils extending in the circumferential direction.

6. A gradient coil system according to claim 5, wherein said ring-shaped $G_z$ gradient coils are fastened to the radially outer disposed saddle-shaped gradient coils and to, said longitudinal support elements.

7. A gradient coil system according to claim 6, wherein the longitudinal support elements extending in the z direction consist of laminated wood or a fiberglass-reinforced plastic.

8. A gradient coil system according to claim 7, wherein said longitudinal support elements extending in the z direction are provided with several mutually spaced recesses which are arranged one behind the other in the z direction.

9. A gradient coil system according to claim 1, wherein said saddle-shaped gradient coils are subdivided into partial saddles.

10. A gradient coil system according to claim 9, wherein the partial saddles are spaced from each other by elastic, formed pieces.

11. A gradient coil system according to claim 10, wherein said elastic support elements are arranged between the coil basket and the hollow-cylindrical support body in zones of the coil basket low in vibrations.

12. A gradient system according to claim 11, and further including sound absorbing material arranged in the space formed between the coil baskets and the hollow cylindrical support body due to said elastic support elements.

13. A gradient system according to claim 1, and further including sound absorbing material arranged in the space formed between the coil baskets and the hollow cylindrical support body due to said elastic support elements.

14. A gradient coil system according to claim 1, wherein said longitudinal support elements extending in the z direction are provided with several mutually spaced recesses which are arranged one behind the other in the z direction.

15. A gradient coil system according to claim 1, wherein said elastic support elements are arranged between the coil basket and the hollow-cylindrical support body in zones of the coil gasket low in vibrations.

16. A gradient coil system according to claim 1, wherein the longitudinal support elements extending in the z direction consist of laminated wood or a fiberglass-reinforced plastic.

17. A gradient coil system according to claim 16, wherein said longitudinal support elements extending in the z direction are provided with several mutually spaced recesses which are arranged one behind the other in the z direction.

18. A gradient coil system according to claim 1, wherein said longitudinal support elements are each fastened to the arc sections of the saddle-shaped gradient coils extending in the circumferential direction.

19. A gradient coil system according to claim 1, wherein said ring-shaped $G_z$ gradient coils are fastened to the radially outer disposed saddle-shaped gradient coils and to, said longitudinal support elements.

20. A gradient coil system according to claim 1, wherein said saddle-shaped gradient coils are arranged on different cylinder surfaces.

* * * * *